(12) United States Patent
Holst et al.

(10) Patent No.: US 8,547,155 B2
(45) Date of Patent: Oct. 1, 2013

(54) SOFT ERROR ROBUST LOW POWER LATCH DEVICE LAYOUT TECHNIQUES

(75) Inventors: John C. Holst, Saratoga, CA (US);
ShiJie Wen, Sunnyvale, CA (US);
Richard J. Wong, Saratoga, CA (US)

(73) Assignee: Cisco Technology, Inc., San Jose, CA (US)

( * ) Notice: Subject to any disclaimer, the term of this patent is extended or adjusted under 35 U.S.C. 154(b) by 23 days.

(21) Appl. No.: 13/214,681

(22) Filed: Aug. 22, 2011

(65) Prior Publication Data

US 2013/0049835 A1  Feb. 28, 2013

(51) Int. Cl.
*H03K 3/02* (2006.01)

(52) U.S. Cl.
USPC ........................................................ 327/199

(58) Field of Classification Search
USPC .................. 327/199–203, 208, 212, 214, 215, 327/218, 564–566
See application file for complete search history.

(56) References Cited

U.S. PATENT DOCUMENTS

| | | | |
|---|---|---|---|
| 5,388,054 A * | 2/1995 | Tokumaru | 716/55 |
| 6,297,668 B1 * | 10/2001 | Schober | 326/101 |
| 6,864,732 B2 | 3/2005 | Chalasani | |
| 7,234,121 B2 * | 6/2007 | Zhu et al. | 716/122 |
| 7,411,432 B1 * | 8/2008 | Zhu | 327/117 |
| 7,576,583 B2 * | 8/2009 | Kuboyama et al. | 327/218 |
| 8,274,319 B2 * | 9/2012 | Maeno | 327/203 |

OTHER PUBLICATIONS

Chen Kong Teh et al., "A 77% Energy-Saving 22-Transistor Single-Phase-Clocking D-Flip-Flop with Adaptive-Coupling Configuration in 40nm CMOS," 2011 IEEE International Solid-State Circuits Conference, Session 19, Low-Power Digital Techniques, 19.4.

* cited by examiner

*Primary Examiner* — Lincoln Donovan
*Assistant Examiner* — Sibin Chen
(74) *Attorney, Agent, or Firm* — Edell, Shapiro & Finnan, LLC

(57) ABSTRACT

A latch device and related layout techniques are provided to reduce soft error rates caused by radiation or other exposure to ionized/charged particles. The latch device comprises a pair of cross-coupled inverters forming a storage cell. A pair of clock pass transistors is coupled to the pair of cross-coupled inverters. The pair of clock pass transistors is configured to receive as input a clock signal. On both true and complement sides of the latch device, a channel-connected region is formed between one of the pair of cross-coupled inverters and one of the pair of clock pass transistors. Each channel-connected region is configured to have a reduced Linear Energy Transfer (LET) cross-section. The reduced LET cross-section results in a reduced soft error rate.

20 Claims, 6 Drawing Sheets

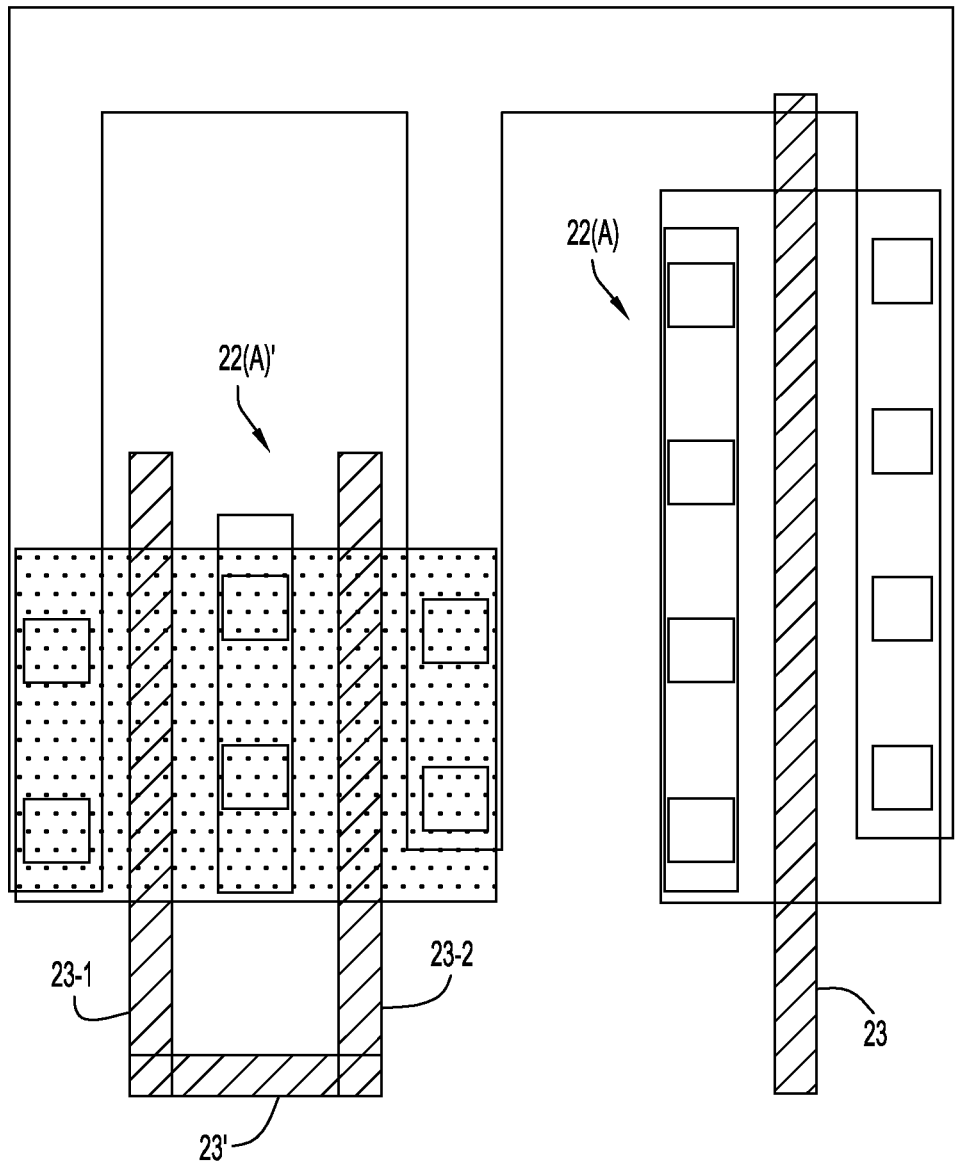
FIG.5
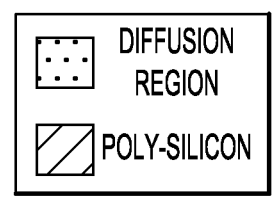

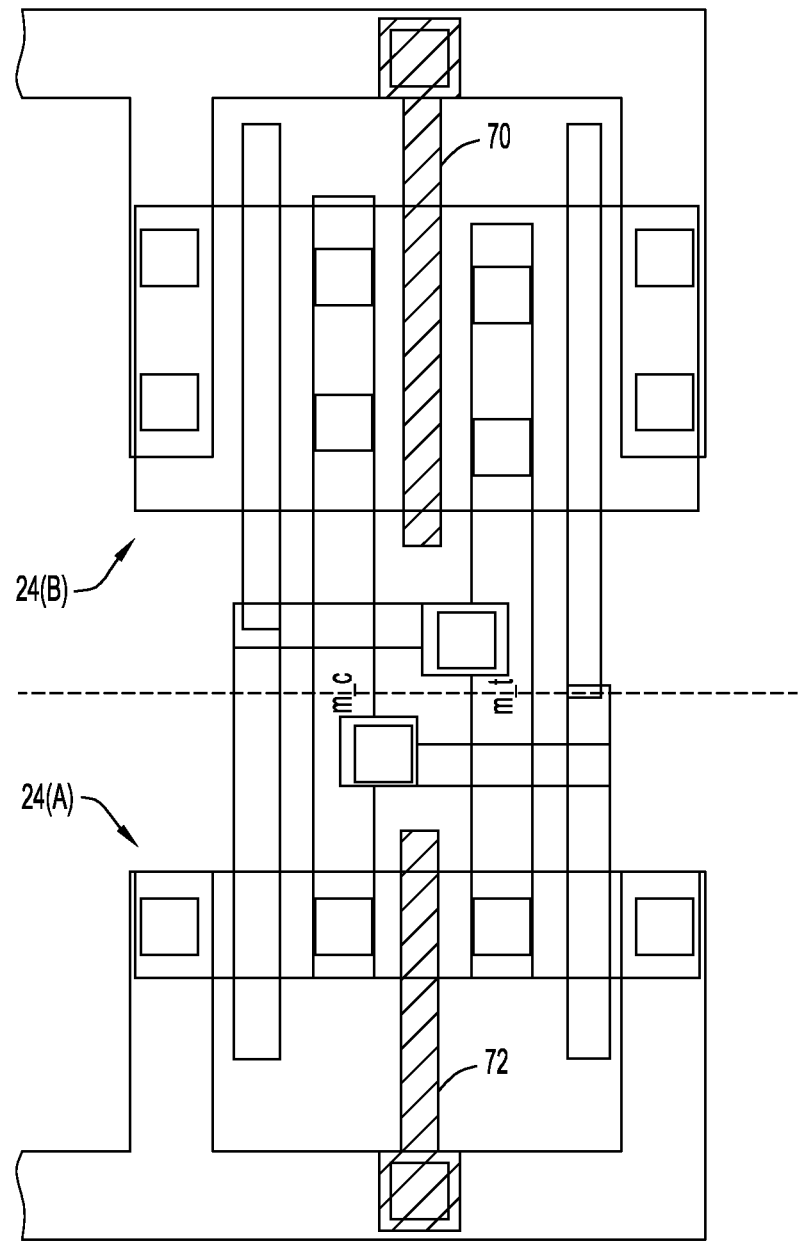
FIG.6
POLY-SILICON

SOFT ERROR ROBUST LOW POWER LATCH DEVICE LAYOUT TECHNIQUES

TECHNICAL FIELD

The present disclosure relates to latch devices.

BACKGROUND

Low power flip-flop devices are configured to consume very low power. In some applications of flip-flop device, the soft error rate (SER) performance, also known as single event upset (SEU) errors, is to be optimized. There are challenges in optimizing SER of a flip-flop without sacrificing power, silicon area, speed and performance.

BRIEF DESCRIPTION OF THE DRAWINGS

FIG. 5 is a diagram illustrating a folded layout technique to reduce the diffusion area of a clock pass transistor of a latch circuit.

FIG. 6 is a diagram illustrating the use of dummy gates to separate complementary storage nodes in a latch circuit.

DESCRIPTION OF EXAMPLE EMBODIMENTS

Overview

A latch device and related layout techniques are provided to reduce soft error rates caused by radiation or other exposure to ionized/charged particles. The latch device comprises a pair of cross-coupled inverters forming a storage cell. A pair of clock pass transistors is coupled to the pair of cross-coupled inverters. The pair of clock pass transistors is configured to receive as input a clock signal. On both true and complement sides of the latch device, a channel-connected region is formed between one of the pair of cross-coupled inverters and one of the pair of clock pass transistors. Each channel-connected region is configured, through any one or more of the layout techniques described herein, to have a reduced Linear Energy Transfer (LET) cross-section. The reduced LET cross-section results in a reduced soft error rate.

Example Embodiments

Figure 1:
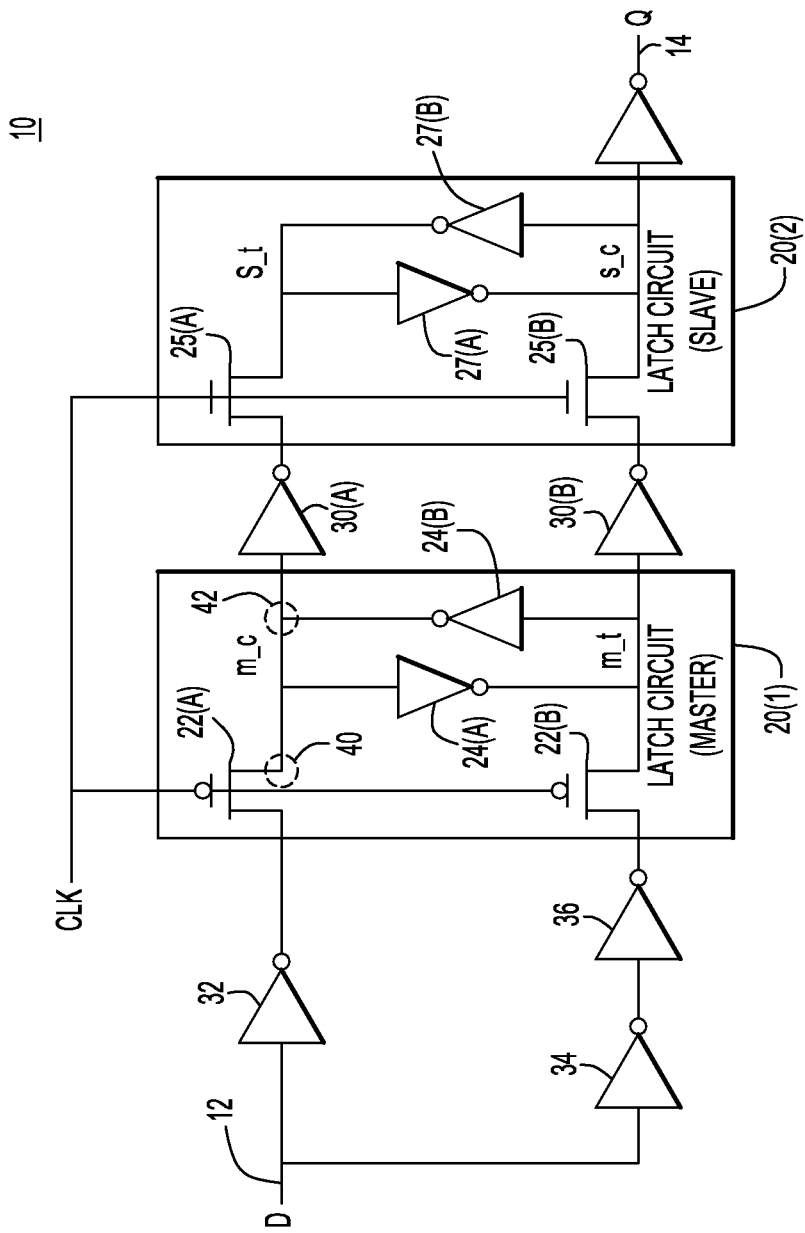
FIG. 1 is a schematic diagram of a flip-flop having a channel-connected region in each latch device with a reduced Linear Energy Transfer cross-section.

Referring first to FIG. 1, a low-power flip-flop device is shown generally at reference numeral 10. In this example, the flip-flop device 10 is a D-type flip-flop comprising an input (D) 12 and an output (Q) 14. There are two latch circuits, 20(1) and 20(2). Latch circuit 20(1) serves as a master latch and latch circuit 20(2) serves as a slave latch. Each latch circuit comprises a pair of clock pass transistors and a pair of cross-coupled inverters. Specifically, latch circuit 20(1) comprises a pair of clock pass transistors 22(A) and 22(B) and a pair of cross-coupled inverters 24(A) and 24(B). Similarly, latch circuit 20(2) comprises a pair of clock pass transistors 25(A) and 25(B) and a pair of cross-coupled inverters 27(A) and 27(B). There is a pair of inverters 30(A) and 30(B) that are coupled between the latch circuits 20(1) and 20(2). In addition, there is an inverter 32 that is coupled between the input 12 and the clock pass transistor 22(A) and two inverters 34 and 36 coupled between the input 12 and the clock pass transistor 22(B). In one example, the clock pass transistors 22(A)/22(B) are P-Field Effect Transistors (PFETs) and the clock pass transistors 25(A)/25(B) are NFETs. Each latch circuit has a "true" side and a "complement" side. The cross-coupled inverters 24(A)/24(B) have a first node denoted master_complement (m_c) and a second node denoted master_true (m_t). Similarly, the cross-coupled inverters 27(A)/27(B) have a first node denoted slave_true (s_t and a second node denoted slave_complement (s_c).

A low power latch circuit is one in which the clock signal paths do not have any inverters. This elimination of inverters in the clock signal path minimizes the capacitance that is switched at the clock frequency.

A clock signal (clk) is coupled to the pairs of clock pass transistors 22(A)/22(B) and 25(A)/25(B) as shown in FIG. 1. When clk is high, node m_c has a channel-connected region that consists of only the output of the feedback inverter and the drain of the PFET clock pass transistor. This is shown at reference numerals 40 and 42. A similar situation occurs at node s_t in the latch circuit 20(2). A smaller channel-connected region of the latch circuits yields a smaller Linear Energy transfer (LET) cross section, which results in a reduced SER. This is to be contrasted with the channel-connected region of a conventional flip-flop that consists of the drains of both (P and N) clock pass transistors, the output of a feedback inverter stack, and the channel and source/drain areas of either the P or N sides of the feedback stack, depending on the polarity of the stored data. This low-power flip-flop design shown in FIG. 1 offers a significant advantage when used in an application specific integrated circuit (ASIC), because it reduces the total power consumption of logic sections by 20-40%. This has been measured in 180 nm, 90 nm, and 40 nm technology generations. One impediment to the widespread adoption of a low-power flip-flop has been the perception that its soft error rate (SER) would be worse than that of a standard flip-flop. SER is a concern in the design of robust, high-availability systems. Through analysis of a test chip in 40 nm technology, it has been determined that the low-power flip-flop has a significantly lower SER rate than standard flip-flop designs, and is at the same level as SER-hardened flip-flop designs.

Figure 2:
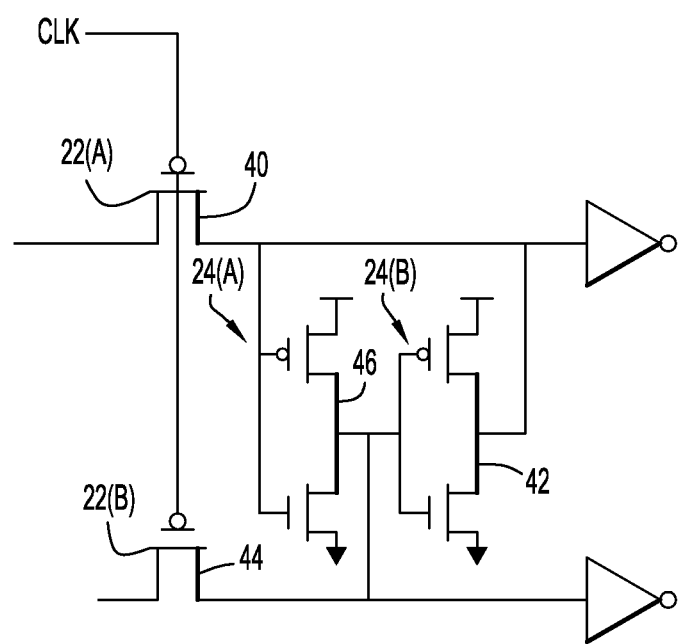
FIG. 2 is a schematic diagram of a latch circuit that is constructed to have a channel-connected region with a reduced Linear Energy Transfer cross-section.

FIG. 2 illustrates in more detail the channel-connected diffusion region that is minimized according to the techniques described herein. In the example of FIG. 2, there is a channel-connected region on the "true" side and a channel connected region on the "complement" side of a single latch, e.g., latch circuit 20(1). The channel-connected region on the "true" side is shown between source 40 of the PFET clock pass transistor 22A and cross-coupled drains of the transistors 42 that make up the inverter 24B. Thus, the channel-connected diffusion area is made up of 3 source/drain areas. Similarly, the channel connected-region on the "complement" side is shown between source 44 of clock pass transistor 22B and cross-coupled drains of transistors 46 that make up inverter 24A.

Variants of the low-power design are possible for building a low-SER latch circuit. For example, a complementary metal oxide silicon (CMOS) transmission gate could be used to drive one side of the feedback latch instead of using the differential (clocked) PFETs in the master stage. One design aspect that contributes to achieving the low-SER performance is the avoidance of the series (stacked) devices in the latch feedback structure.

Through modeling and simulation, several layout techniques have been developed that further reduce the SER of the low-power latch circuits used in a low-power flip-flop. These layout techniques also improve the SER of other flip-flop designs, i.e., non-low-power, as well.

Figure 3:
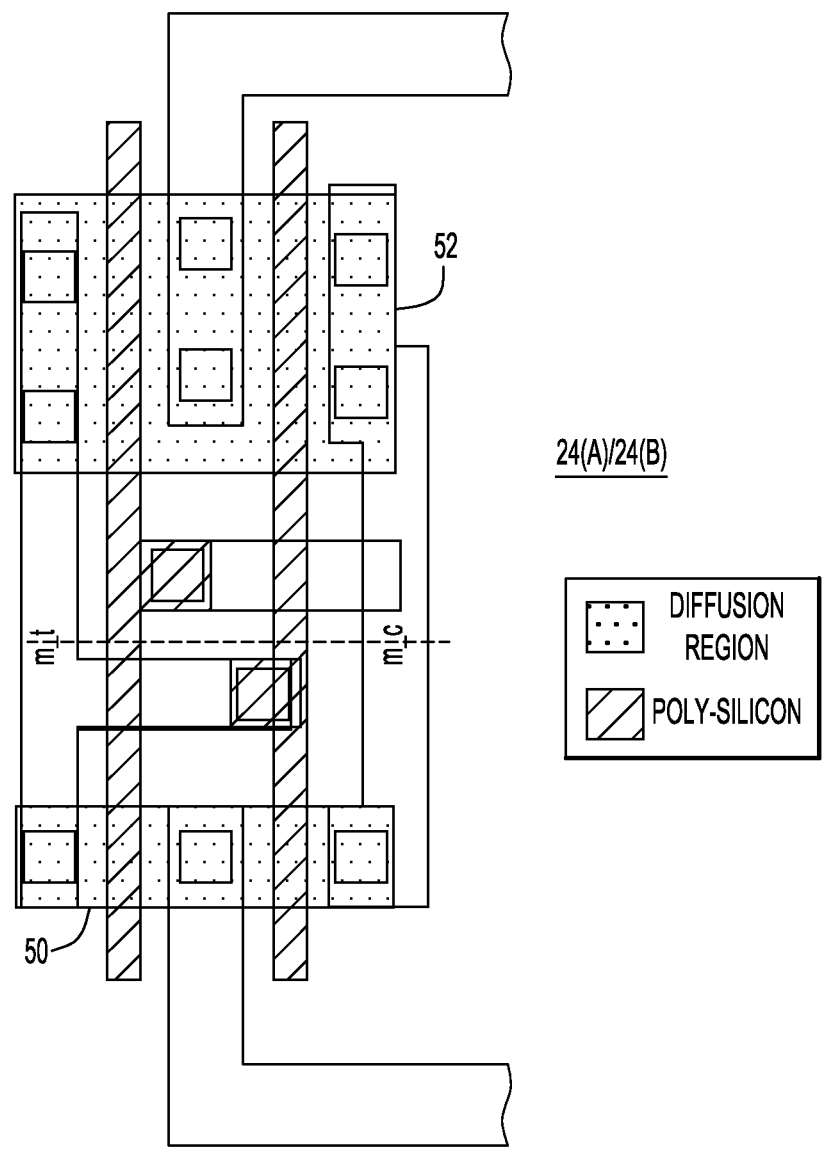
FIG. 3 is a diagram illustrating a layout technique in which complementary storage nodes of a latch circuit are constructed in the same diffusion area.

Referring now to FIG. 3, a first layout technique is now described. This layout technique involves constructing the complementary storage nodes in the same diffusion region. In the example of FIG. 3, the NFET regions of nodes m_c and m_t of the pair of cross-coupled inverters are constructed or formed in a common diffusion region and thus are not separated by an isolation region. This is shown at reference numeral 50. The same may apply to the PFET regions of these nodes shown at 52. Thus, the pair of cross-coupled inverters may comprise NFET regions and PFET regions that are formed in respective common diffusion regions (50 and 52). While only the layout for a single (master) latch is shown in FIG. 3, this technique also applies to nodes s_t and s_c of the slave latch.

This technique reduces the SER is because there is a tendency for the charge generated by an ionized particle to be collected by all nodes in a diffusion region. Using this layout technique, the charge is collected by both sides of a latch structure (since both sides are in the same diffusion region), making it less likely for the latch to change its state due to the ionized particle.

Figure 4:
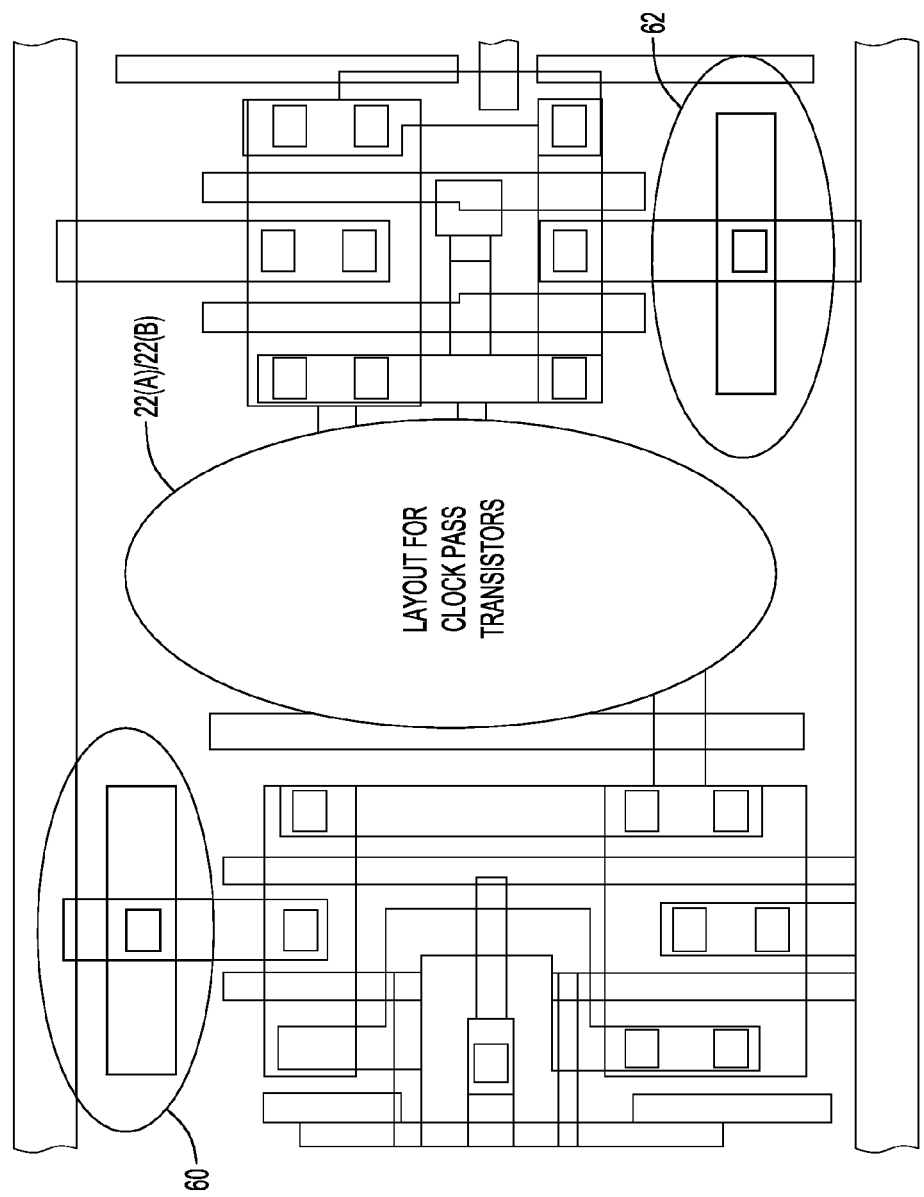
FIG. 4 is a diagram illustrating a layout technique in which substrate and well ties are placed proximate clock pass transistors in a latch circuit.

Turning now to FIG. 4, another layout technique is shown. In this technique, the substrate/well ties are placed "proximate" the clock pass transistors. In the layout of FIG. 4, the clock pass transistors are shown at 22(A)/22(B). One N-well and one substrate tie have been added and are shown at 60 and 62, respectively. The width of the layout in this example is 12×0.14 microns (from top to bottom) using 40 nm technology. Conventional layout techniques will put the well/tie approximately 30 microns from the clock pass transistors. By contrast, according to the layout techniques shown in FIG. 4, the substrate/well ties are within one micron of the clock pass transistors. When the well and substrate ties are formed this close to the clock pass transistors, these ties absorb the generated charge well associated with absorbed radiation to prevent a significant change in the voltage bias of the local well and substrate. To do this, the resistance between the well/substrate tie and the base of the parasitic bipolar has to be low enough that the V=IR voltage stays significantly below the Vbe voltage of the parasitic bipolar, where I is the current generated by the charged particles of the radiation strike. This depends on the resistance of the substrate/well and the electrical properties of the bipolar. The exact distance will depend on the particular semiconductor fabrication process technology employed. The 30 micron design rule is typically sufficient to absorb currents generated by hot carriers, preventing those currents from de-biasing the substrate/well. Radiation can generate much more current (as much as 10× more current), so the resistance (distance to the substrate tie) is reduced accordingly to absorb the larger currents associated with radiation.

In summary, the techniques of FIG. 4 operate as follows. When charged particles with high energy strike nearby, they generate enough charge to significantly change the voltage bias of the local well and substrate region. In this case, the parasitic bipolar devices associated with the (off) clock pass transistors can turn on and drive the feedback latch to a different state. Placing local well/substrate ties close to clock pass transistors counters deters this de-biasing effect, increasing the SEU resistance of the latch circuit.

Reference is now made to FIG. 5 for a technique that is useful to minimize the diffusion region area of a latch circuit. Reducing the diffusion area reduces the cross-section of these nodes, which in turn reduces the SER of the latch circuit. One way to reduce the diffusion area for a transistor is to use a "folded" layout technique instead of an "open" layout technique. The clock pass PFET 22(A) (from FIG. 1) that drives node m_c is typically large enough that it can be folded into two devices that share the same diffusion attached to node m_c, effectively reducing that diffusion area by a factor of 2.

FIG. 5 shows on the right, a transistor 22(A) with a standard layout where the gate 23 is one unitary element. The transistor on the left at reference numeral 22(A)' has a split or folded gate 23' with two parallel gate components/devices 23-1 and 23-2 that share the same/common diffusion region. This "folded" layout technique results in the area of node "m_t" being approximately half the area of the "open" layout technique on the right. A latch circuit that uses the folded layout technique will have a lower SER.

Reference is now made to FIG. 6 for still another technique to reduce SER in a latch circuit. In this technique, "dummy" gates are arranged to separate the complementary storage nodes of a latch circuit. There is a dummy gate 70 shown for the cross-coupled inverter 24(A) and a dummy gate 72 for the cross-coupled inverter 24(B) in the example of FIG. 6. In one example, a dummy gate is an NFET with its gate tied to a supply voltage VSS or a PFET with its gate tied to a supply voltage VDD. The dummy gates 70 and 72 are always turned off. Use of dummy gates allows sensitive nodes to be placed as close together as possible. The use of dummy gates allows the complementary nodes to be as physically close together as possible, providing for low SER. Modeling has shown that this technique is very effective in reducing the diffusion area of sensitive nodes. Dummy gates may be used in conjunction with any of the other techniques described herein. Furthermore, the use of dummy gates is also useful for the clock pass transistors.

Placing nodes in the same diffusion region and as close together as possible has several benefits. First, the amount of charge collected by any one node is reduced. Second, charge collected by both nodes of a complementary pair tends to produce a common offset voltage, which does not cause the latch to change state.

Any two or more of the layout techniques described above in connection with FIGS. 3-6 may be used in any combination. Moreover, any one or more of these techniques may be used for each of a master latch device and a slave latch device in a flip-flop device.

The layout techniques described herein achieve manifold improvement in SER performance for a D-flip-flop, while maintaining a substantial power savings (25%) in otherwise the same silicon area.

The above description is intended by way of example only.

What is claimed is:
1. A latch device comprising:
a pair of cross-coupled inverters forming a storage cell;
a pair of clock pass transistors coupled to the pair of cross-coupled inverters, the pair of clock pass transistors configured to receive as input a clock signal; and
on both true and complement sides, a channel-connected region is formed between one of the pair of cross-coupled inverters and one of the pair of clock pass transistors, each channel-connected region configured to have a reduced Linear Energy Transfer cross-section, wherein the pair of cross-coupled inverters is formed in a common diffusion region and the inverters are not separated by an isolation region.

2. The latch device of claim 1, wherein the channel-connected region has a reduced Linear Energy Transfer cross-section resulting in a reduced soft error rate.

3. The latch device of claim 1, wherein the pair of cross-coupled inverters comprises N-Field Effect Transistor (NFET) regions and P-Field Effect Transistor (PFET) regions that are formed in respective common diffusion regions.

4. The latch device of claim 1, and further comprising a substrate tie and a well tie formed proximate the pair of clock pass transistors.

5. The latch device of claim 1, and further comprising a dummy gate arranged to separate complementary nodes of the pair of cross-coupled inverters.

6. The latch device, of claim 5, wherein the dummy gate comprises a N-Field Effect Transistor (NFET) having a gate tied to a source voltage.

7. The latch device, of claim 5, wherein the dummy gate comprises a P-Field Effect Transistor (PFET) having a gate tied to a drain voltage.

8. A flip-flop comprises a master latch device according to claim 1 coupled to a slave latch according to claim 1.

9. A latch device comprising:
a pair of cross-coupled inverters forming a storage cell;
a pair of clock pass transistors coupled to the pair of cross-coupled inverters, the pair of clock pass transistors configured to receive as input a clock signal; and
on both true and complement sides, a channel-connected region is formed between one of the pair of cross-coupled inverters and one of the pair of clock pass transistors, each channel-connected region configured to have a reduced Linear Energy Transfer cross-section,
wherein the pair of cross-coupled inverters is formed in a common diffusion region;
wherein the pair of clock pass transistors are formed of transistors with a reduced diffusion area; and
wherein the pair of clock pass transistors comprise transistors having a folded layout in which a gate of each of the transistors is separated into two gate components that share the same diffusion region.

10. A latch device comprising:
a pair of cross-coupled inverters forming a storage cell; and
a pair of clock pass transistors coupled to the pair of cross-coupled inverters, the pair of clock pass transistors configured to receive as input a clock signal, wherein the pair of clock pass transistors comprise transistors having a folded layout in which a gate of each of the transistors is separated into two gate components that share the same diffusion region.

11. The latch device of claim 10, wherein the pair of cross-coupled inverters is formed in a common diffusion region.

12. The latch device of claim 11, wherein the pair of cross-coupled inverters comprises N-Field Effect Transistor (NFET) regions and P-Field Effect Transistor (PFET) regions that are formed in the common diffusion region.

13. The latch device of claim 10, and further comprising a substrate tie and a well tie formed proximate the pair of clock pass transistors.

14. The latch device of claim 10, and further comprising a dummy gate arranged to separate complementary nodes of the pair of cross-coupled inverters.

15. A flip-flop comprises a master latch device according to claim 10 coupled to a slave latch according to claim 10.

16. A latch device comprising:
a pair of cross-coupled inverters forming a storage cell;
a pair of clock pass transistors coupled to the pair of cross-coupled inverters, the pair of clock pass transistors configured to receive as input a clock signal; and
a dummy gate arranged to separate complementary nodes of the pair of cross-coupled inverters,
wherein the pair of cross-coupled inverters is formed in a common diffusion region and the inverters are not separated by an isolation region.

17. The latch device claim 16, wherein the dummy gate comprises an N-Field Effect Transistor (NFET) having a gate tied to a supply voltage.

18. The latch device of claim 16, wherein the dummy gate comprises a P-Field Effect Transistor (PFET) having a gate tied to a supply voltage.

19. The latch device of claim 16, wherein the pair of clock pass transistors are formed of transistors with a reduced diffusion area.

20. The latch device of claim 19, wherein the pair of clock pass transistors comprise transistors having a folded layout in which a gate of each of the transistors is separated into two gate components that share the same diffusion region.

* * * * *